US012772493B2

(12) United States Patent
Kim et al.

(10) Patent No.: US 12,772,493 B2
(45) Date of Patent: Oct. 20, 2026

(54) SILICON CARBIDE POWER SEMICONDUCTOR DEVICE

(71) Applicant: DB HiTek Co., Ltd., Bucheon-si (KR)

(72) Inventors: Seung Hyun Kim, Bucheon-si (KR); Hee Bae Lee, Bucheon-si (KR); Jae Yuhn Moon, Bucheon-si (KR); Gyu Hyun Jung, Bucheon-si (KR); Soon Jong Park, Bucheon-si (KR)

(73) Assignee: DB HiTek Co., Ltd., Bucheon-si (KR)

(*) Notice: Subject to any disclaimer, the term of this patent is extended or adjusted under 35 U.S.C. 154(b) by 541 days.

(21) Appl. No.: 18/358,100

(22) Filed: Jul. 25, 2023

(65) Prior Publication Data

US 2024/0405119 A1 Dec. 5, 2024

(30) Foreign Application Priority Data

Jun. 1, 2023 (KR) ........................ 10-2023-0070955

(51) Int. Cl.

*H10D 30/66* (2025.01)
*H10D 62/10* (2025.01)
*H10D 62/832* (2025.01)

(52) U.S. Cl.

CPC ........... *H10D 30/66* (2025.01); *H10D 62/107* (2025.01); *H10D 62/127* (2025.01); *H10D 62/8325* (2025.01)

(58) Field of Classification Search

CPC .... H10D 30/66; H10D 62/107; H10D 62/127; H10D 62/8325; H10D 62/393
See application file for complete search history.

(56) References Cited

U.S. PATENT DOCUMENTS

| | | | | |
|---|---|---|---|---|
| 9,214,572 | B2 | 12/2015 | Banerjee et al. | |
| 9,525,057 | B2 * | 12/2016 | Miura | H10D 30/66 |
| 9,853,147 | B2 | 12/2017 | Banerjee et al. | |
| 10,361,302 | B2 | 7/2019 | Banerjee et al. | |
| 2015/0084066 | A1 | 3/2015 | Banerjee et al. | |
| 2016/0093733 | A1 | 3/2016 | Banerjee et al. | |
| 2018/0047844 | A1 | 2/2018 | Banerjee et al. | |
| 2022/0085171 | A1 * | 3/2022 | Baliga | H10D 62/107 |
| 2022/0173227 | A1 * | 6/2022 | Islam | H10D 62/151 |
| 2024/0079275 | A1 * | 3/2024 | Tsuji | H10D 30/668 |

FOREIGN PATENT DOCUMENTS

| | | | | |
|---|---|---|---|---|
| KR | 10-2414729 B1 | | 6/2022 | |
| WO | WO-2023058209 A1 | * | 4/2023 | H10D 64/01366 |

* cited by examiner

*Primary Examiner* — Leonard Chang
*Assistant Examiner* — William Adrovel
(74) *Attorney, Agent, or Firm* — Central California IP Group, P.C.; Andrew D. Fortney

(57) ABSTRACT

Disclosed is a silicon carbide power semiconductor device and, more particularly, a silicon carbide power semiconductor device capable of improving on-resistance characteristics by contacting at least one lowermost surface of a base or a source with an underlying JFET region.

15 Claims, 10 Drawing Sheets

SILICON CARBIDE POWER SEMICONDUCTOR DEVICE

CROSS REFERENCE TO RELATED APPLICATION

The present application claims priority to Korean Patent Application No. 10-2023-0070955, filed Jun. 1, 2023, the entire contents of which are incorporated herein for all purposes by this reference.

BACKGROUND OF THE INVENTION

Field of the Invention

The present disclosure relates to a silicon carbide power semiconductor device and, more particularly, to a silicon carbide power semiconductor device capable of improving on-resistance characteristics by having at least one lowermost surface of a base or a source in contact with a junction field effect transistor (JFET) region therebelow.

Description of the Related Art

Silicon carbide (SiC) power semiconductor devices have a higher band gap, thermal conductivity, and breakdown field strength than Si devices. Owing to features such as high-temperature operation, low resistance at the same rating, and high current density, SiC power semiconductor devices have electrical properties suitable for power electronics applications. However, a major drawback of SiC power semiconductor devices in terms of applications is that the gate threshold voltage (VGS) to obtain the same rated current as a Si power semiconductor device is relatively high because of poor channel mobility and trans-conductance characteristics, due to traps and low electron concentration at a $SiO_2$/SiC interface.

FIGS. 1A and 1B are cross-sectional views of a conventional silicon carbide (SiC) power semiconductor device. Hereinafter, the structure and problems of the conventional device will be described in detail with reference to FIGS. 1A and 1B.

Referring to FIG. 1A, a conventional SiC power semiconductor device 9 may be or include an inversion mode MOSFET. The power semiconductor device 9 comprises a source 910 having a second conductivity type, a base 930 having a first conductivity type, and a drift region 950 having the second conductivity type. The base 930 between the source 910 and the drift region 950 is controlled by a gate 970. When a positive bias is applied to the gate 970, the base 930 below the gate 970 is inverted (e.g., acquires a negative charge), and an electric current may be conducted. In the case of such an inversion mode MOSFET, there is a problem in that on-resistance (Ron) characteristics of the device 9 decrease due to relatively low channel mobility.

Referring to FIG. 1B, a conventional SiC power semiconductor device 9' relates to an accumulation mode MOSFET (ACCUFET). Unlike the power semiconductor device 9 of FIG. 1A, in this power semiconductor device 9', a base 930' has the second conductivity type instead of the first conductivity type. Accordingly, a source 910', the base 930', and a drift region 950' have the second conductivity type (e.g., N-type). Despite its advantage of improving channel mobility compared to the inversion mode MOSFET, the accumulation mode MOSFET has disadvantages such as poor breakdown voltage (BV) and current leakage, and safety problems due to a low threshold voltage. Thus, an ACCUFET structure with improved characteristics is desired.

DOCUMENT OF RELATED ART

Korean Patent No. 10-2414729, entitled "HIGH VOLTAGE MOSFET DEVICE AND METHOD OF MANUFACTURING SAME."

SUMMARY OF THE INVENTION

Accordingly, the present disclosure has been made keeping in mind the above problems occurring in the related art, and the present disclosure is directed to providing a silicon carbide power semiconductor device capable of improving on-resistance characteristics by having at least one lowermost surface of a base or a source contact a junction field effect transistor (JFET) region therebelow.

In addition, the present disclosure is directed to providing a silicon carbide power semiconductor device capable of improving the resistance characteristics of the JFET region according to an increase in the cross-sectional area or volume of the JFET region, and thereby improving the on-resistance characteristics of the device by including an opening in a shield region below a gate (e.g., of the silicon carbide power semiconductor device).

In addition, the present disclosure is directed to providing a silicon carbide power semiconductor device in which the opening(s) have an island-type shape (e.g., they are disconnected from each other along a length direction).

In addition, the present disclosure is directed to providing a silicon carbide power semiconductor device in which the JFET region in the opening is completely depleted to achieve the normally-off characteristics of the device. In such a device, the JFET region and the shield region may alternate laterally along a width direction.

In addition, the present disclosure is directed to providing a silicon carbide power semiconductor device capable of improving the on-resistance characteristics (e.g., of the silicon carbide power semiconductor device) according to the increase in the cross-sectional area or volume of the JFET region. In such a device, the shield region may have a varying width, and the base may have a lowermost surface, for example, that alternatingly contacts the shield region and the JFET region along the length direction.

In addition, the present disclosure is directed to providing a silicon carbide power semiconductor device in which the JFET region in a recess (e.g., of the silicon carbide power semiconductor device) is fully depleted to achieve the normally-off characteristics of the device. In such a device, shield region and the JFET region may include a plurality of alternating protrusions (e.g., along a predetermined direction).

In addition, the present disclosure is directed to providing a silicon carbide power semiconductor device that improves the on-resistance characteristics (e.g., of the silicon carbide power semiconductor device) by smooth current flow. In such a device, the JFET region may surround a lower side or lowermost surface of the shield region.

The disclosure may be implemented by embodiments having the following configurations in order to achieve the above-described objectives.

According to an embodiment of the present disclosure, there is provided a silicon carbide power semiconductor device, including a substrate; a drift region having a second conductivity type on the substrate; a JFET region having the second conductivity type on the drift region; a shield region having a first conductivity type on the drift region; a source having the second conductivity type on the shield region; a base having the second conductivity type, on the shield region, between the source and the JFET region; a gate including a gate insulating layer on the JFET region and a gate electrode on the gate insulating layer, a source metal on the source; and a drain metal on a surface of the substrate opposite from the drift region, wherein the shield region may have one or more openings therein.

According to another embodiment, in the silicon carbide power semiconductor device according to the present disclosure, the openings may be under the source.

According to still another embodiment, in the silicon carbide power semiconductor device according to the present disclosure, the openings may be spaced apart from each other (e.g., along a length direction).

According to still another embodiment, in the silicon carbide power semiconductor device according to the present disclosure, the JFET region may contact a lowermost surface of the source and/or the base through the openings.

According to still another embodiment, in the silicon carbide power semiconductor device according to the present disclosure, the JFET region may have a lowermost surface at a position deeper than that of the shield region.

According to still another embodiment, the silicon carbide power semiconductor device according to the present disclosure may further include a highly doped region having the first conductivity type on the shield region, adjacent to or in contact with the source.

According to still another embodiment, a silicon carbide power semiconductor device according to the present disclosure includes a substrate; a drift region having a second conductivity type on the substrate; a JFET region having the second conductivity type above the drift region; a shield region having a first conductivity type on the drift region; a base having the second conductivity type, on the shield region and having a sidewall in contact with the JFET region; a source having the second conductivity type on the shield region; and a gate including a gate insulating layer on the JFET region and a gate electrode on the gate insulating layer, wherein the base may have at least one lowermost surface in contact with the JFET region.

According to still another embodiment, in the silicon carbide power semiconductor device according to the present disclosure, the shield region may have a varying width as the shield region extends along a length direction.

According to still another embodiment, in the silicon carbide power semiconductor device according to the present disclosure, the shield region may be continuous along a width direction.

According to still another embodiment, in the silicon carbide power semiconductor device according to the present disclosure, the shield region may have a sidewall below the gate a with a plurality of alternating protrusions and recesses.

According to still another embodiment, in the silicon carbide power semiconductor device according to the present disclosure, the protrusion may be in contact with lowermost surfaces of the source and the base along the width direction.

According to still another embodiment, in the silicon carbide power semiconductor device according to the present disclosure, the lowermost surface of the base may contact the JFET region in the recesses.

According to still another embodiment, in the silicon carbide power semiconductor device according to the present disclosure, the JFET region may include a subregion immediately below the gate; and a carrier storage layer in contact with a lowermost surface of the shield region.

According to still another embodiment, the silicon carbide power semiconductor device according to the present disclosure may comprise first and second shield regions on opposite sides of the gate having sidewalls that are symmetrical or asymmetrical to each other with respect to a central plane of the gate along a length direction.

According to still another embodiment, a silicon carbide power semiconductor device according to the present disclosure includes a substrate; a drift region on the substrate; a JFET region on the drift region; a shield region on the drift region; a source on the shield region; a base on the shield region, between the source and the JFET region; and a gate on the JFET region, wherein the base and/or the source may have a lowermost surface that contacts the JFET region.

According to still another embodiment, in the silicon carbide power semiconductor device according to the present disclosure, the shield region may include an opening, and the JFET region may be in contact with the source and/or the base through the opening.

According to still another embodiment, in the silicon carbide power semiconductor device according to the present disclosure, the source, the base, and the drift region may have a same conductivity type.

According to still another embodiment, in the silicon carbide power semiconductor device according to the present disclosure, the shield region may comprise a plurality of openings spaced apart from each other (e.g., along a length direction).

According to still another embodiment, in the silicon carbide power semiconductor device according to the present disclosure, the shield region may have a sidewall spaced apart from a sidewall of the base under the gate (e.g., along a width direction).

According to still another embodiment, in the silicon carbide power semiconductor device according to the present disclosure, the base may have a lowermost surface at a position higher or shallower than that of the source.

By the above configurations, the present disclosure has the following effects.

According to the present disclosure, it is possible to improve on-resistance characteristics (e.g., of the silicon carbide power semiconductor device) by having at least one lowermost surface of a base or a source in contact with a JFET region therebelow.

In addition, according to the present disclosure, it is possible to improve the resistance characteristics of the JFET region according to the increase in the cross-sectional area or volume of the JFET region, and thereby improve the on-resistance characteristics of the device by including one or more openings in a shield region below a gate (e.g., of the silicon carbide power semiconductor device).

In addition, according to the present disclosure, the openings may have an island-type shape (e.g., disconnected from each other along the length direction).

In addition, according to the present disclosure, it is possible to achieve the normally-off characteristics of the device as the JFET region in the opening is completely depleted, as the shield region and the JFET region may repeatedly alternate along the width direction.

In addition, according to the present disclosure, it is possible to improve the on-resistance characteristics (e.g., of the silicon carbide power semiconductor device) according to the increase in the cross-sectional area or volume of the JFET region when the lowermost surface of the base is over the opening(s).

In addition, according to the present disclosure, it is possible to achieve the normally-off characteristics of the device as the JFET region in a recess (e.g., in the shield region) is fully depleted when the shield region has a plurality of alternating protrusion and recesses along a predetermined direction.

In addition, according to the present disclosure, it is possible to improve the on-resistance characteristics (e.g., of the silicon carbide power semiconductor device) by smooth current flow when the JFET region surrounds the lowermost surface of the shield region.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, the embodiments are provided only for reference, in order to more completely explain the present disclosure to those skilled in the art.

As used herein, the singular form may include the plural form, unless the context clearly indicates otherwise. In addition, as used herein, the terms "comprise" and "comprising" specify the presence of the recited shapes, numbers, steps, operations, members, elements, and/or groups thereof, but do not exclude the presence or addition of one or more other shapes, numbers, steps, operations, members, elements, and/or groups thereof.

Hereinafter, it should be noted that when one component (or layer) is described as being on another component (or layer), the one component may be directly on the other component, or one or more third components or layers may be between the one component and the other component. In addition, when one component is expressed as being directly on or above another component, no other components are between the one component and the other component. Moreover, being located on "top", "upper", "lower", "above", "below" or "one (first) side" or "an opposite side" of a component refers to a relative positional relationship.

Hereinafter, a first conductivity type impurity region will be understood as, for example, a "P-type" or "N-type" doped region, and a second conductivity type impurity region will be understood as a doped region having the other type (i.e., N-type or P-type). In some cases, the first conductivity type impurity region may be a "P-type" region and the second conductivity type impurity region may be an "N-type" doped region, but there is no limitation thereto.

In addition, in the Figures showing a plan view, the x-axis direction is referred to as the "width direction" and the y-axis direction is referred to as the "length direction". It should be noted that for convenience of description and to show a clear structure of a shield region in the plan view, only portions of the gate electrode, the shield region and the JFET region are specifically expressed.

A silicon carbide power semiconductor device 1 to be described below is preferably an accumulation mode MOSFET (hereinafter referred to as "ACCUFET").

Figure 1A:
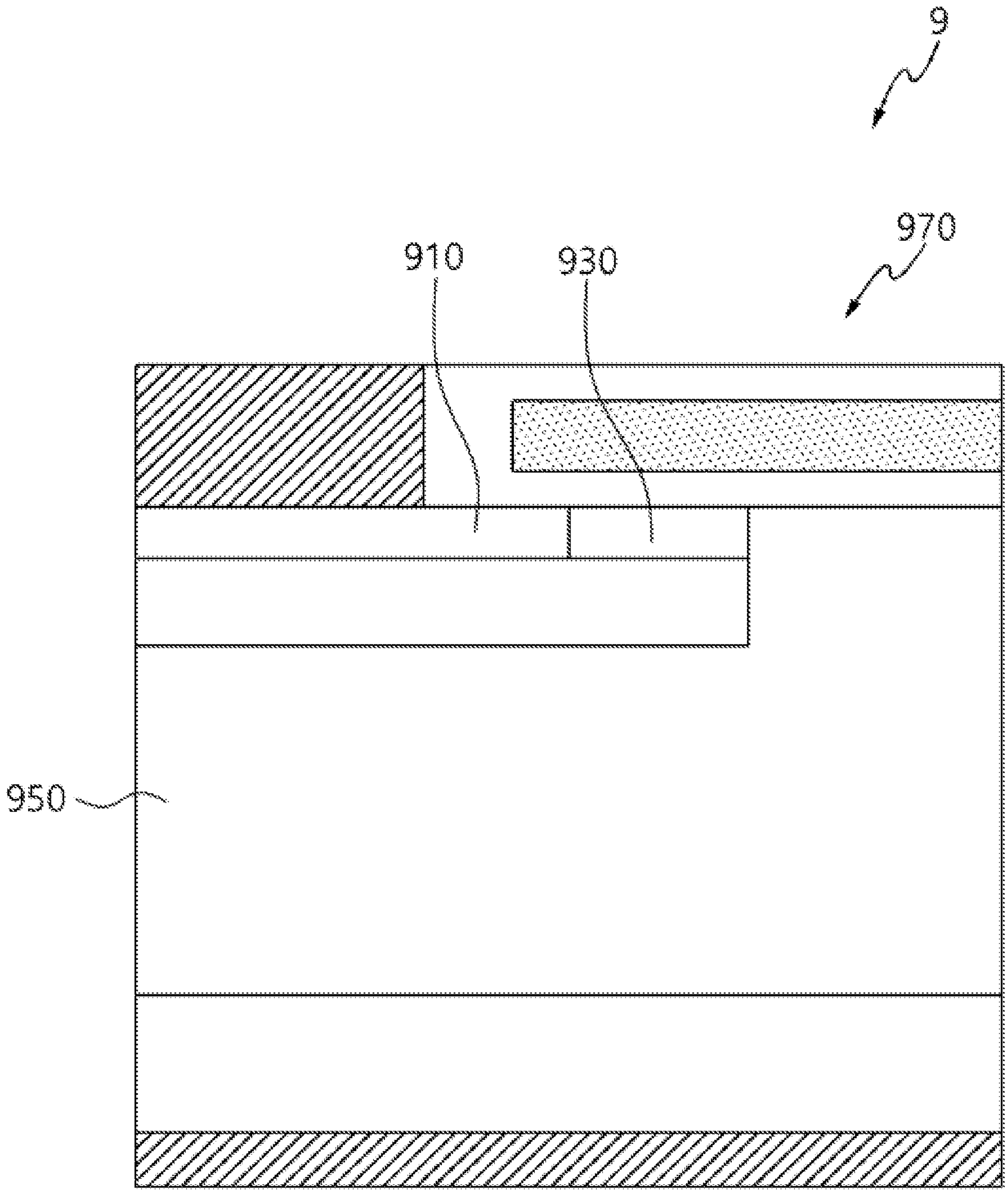
FIG. 1A PRIOR ART
FIGS. 1A and 1B are cross-sectional views of a conventional silicon carbide power semiconductor device.
Figure 1B:
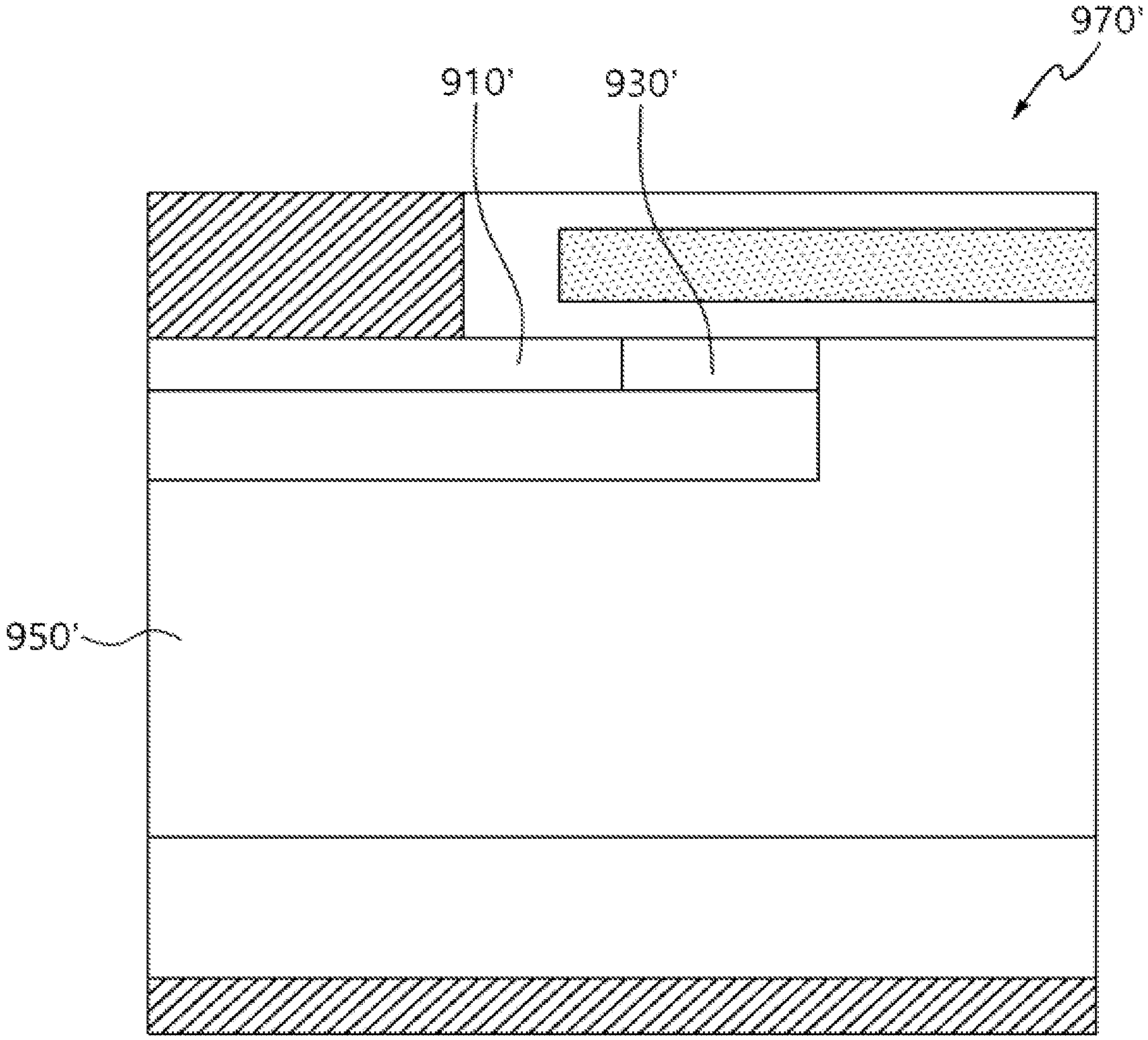
FIG. 1B PRIOR ART
Figure 2:
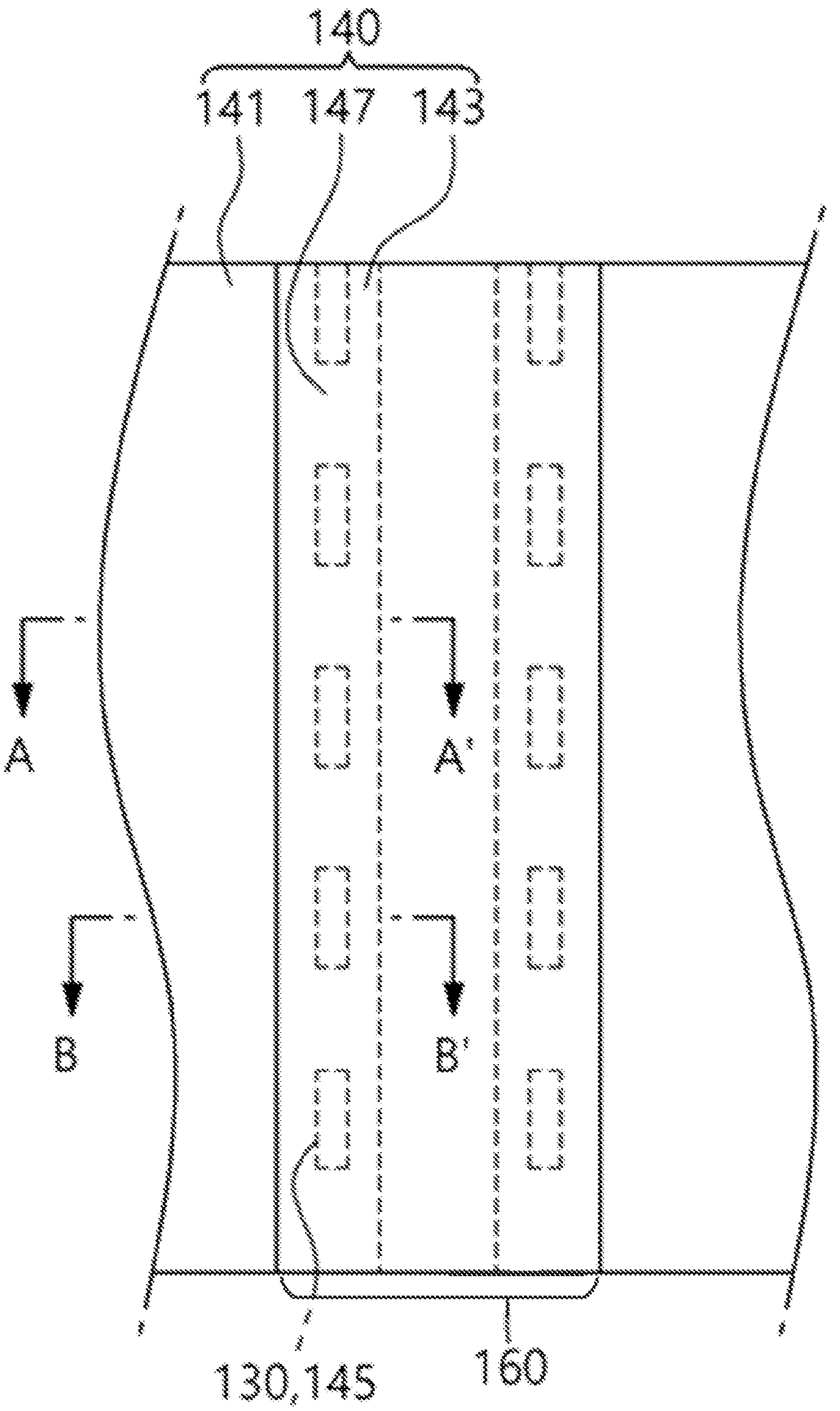
FIG. 2 is a plan view of a silicon carbide power semiconductor device according to a first embodiment of the present disclosure.
Figure 3:
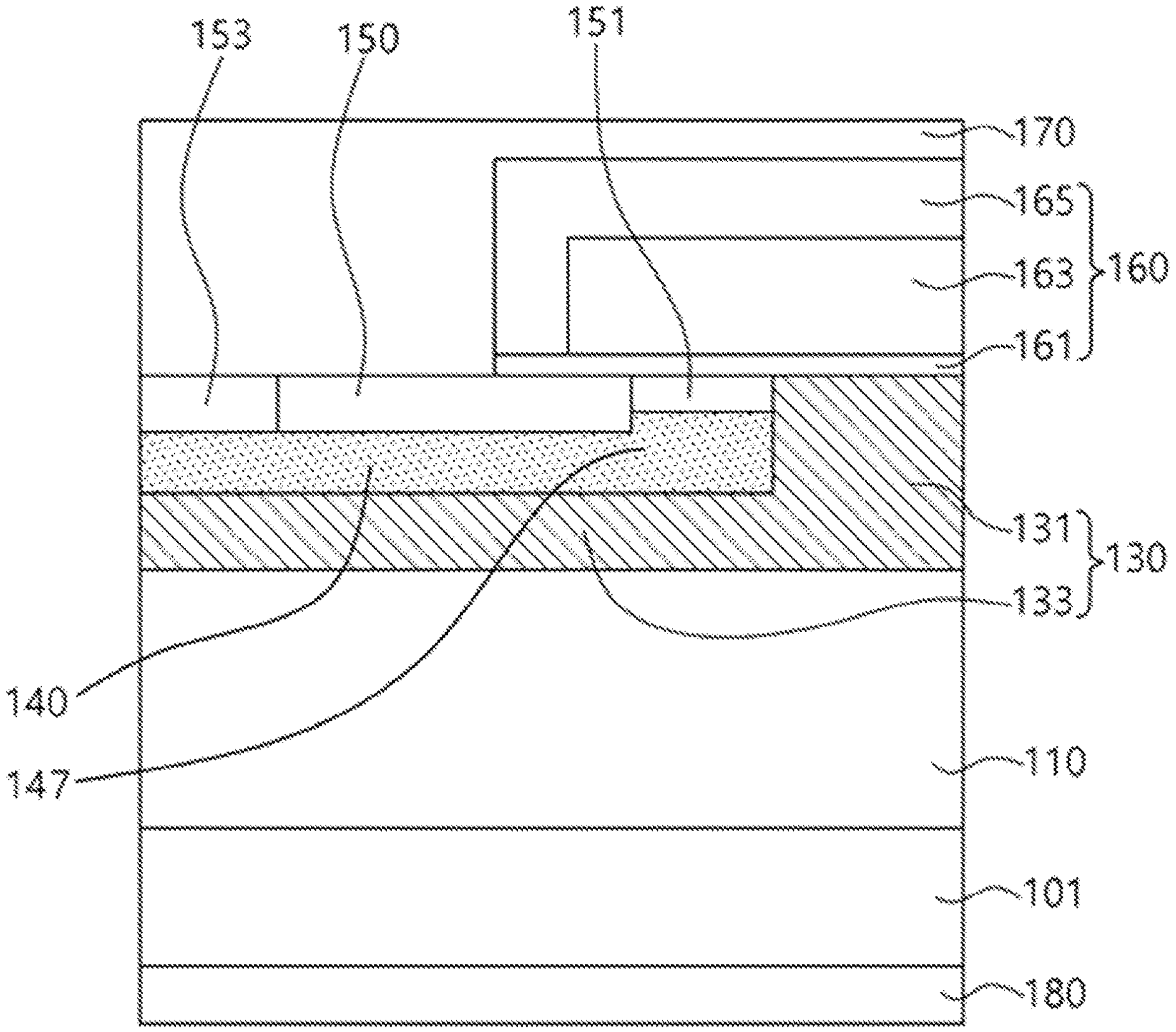
FIG. 3 is a cross-sectional view along the line A-A' in FIG. 2.
Figure 4:
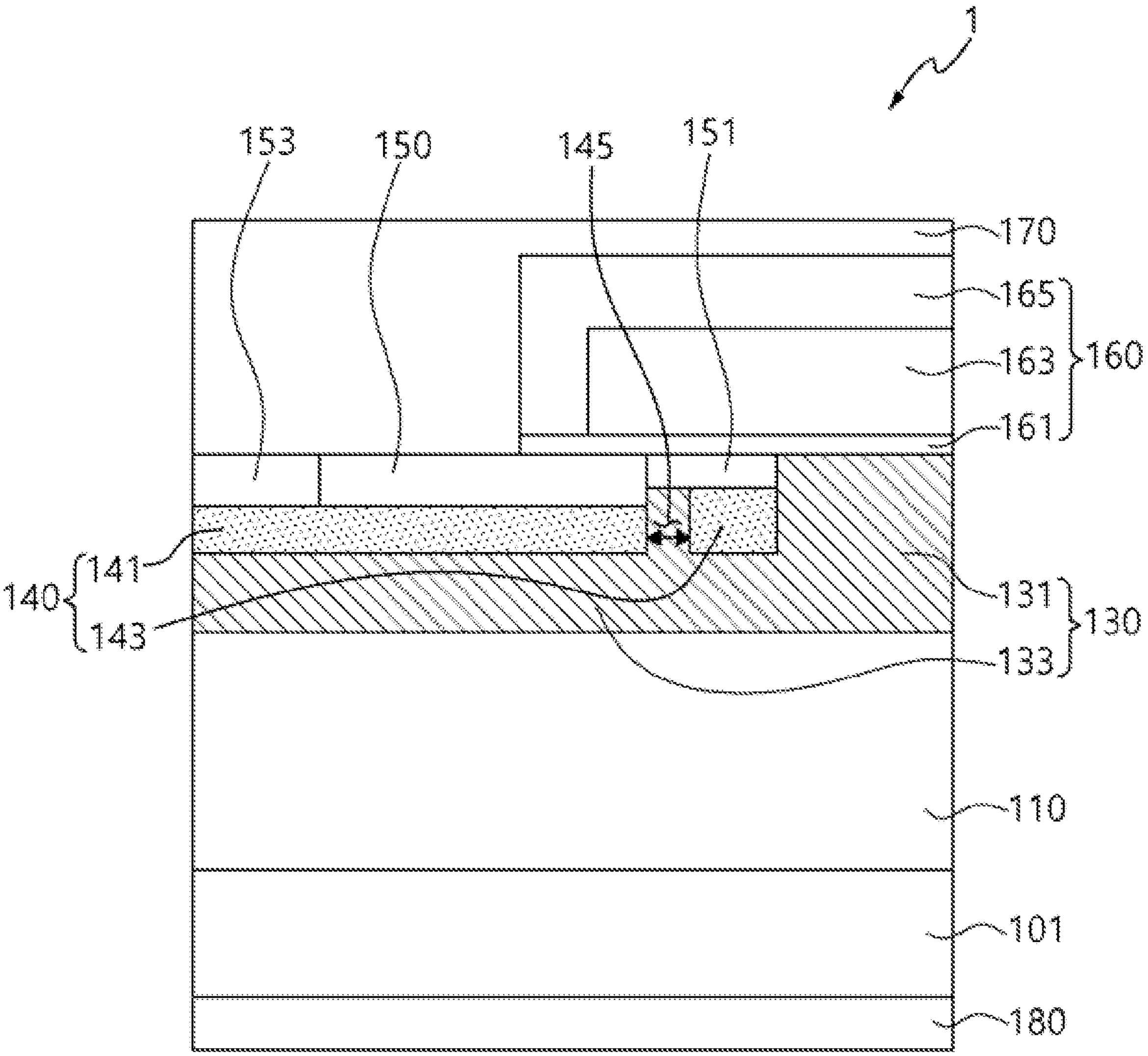
FIG. 4 is a cross-sectional view along the line B-B' in FIG. 2.
Figure 5:
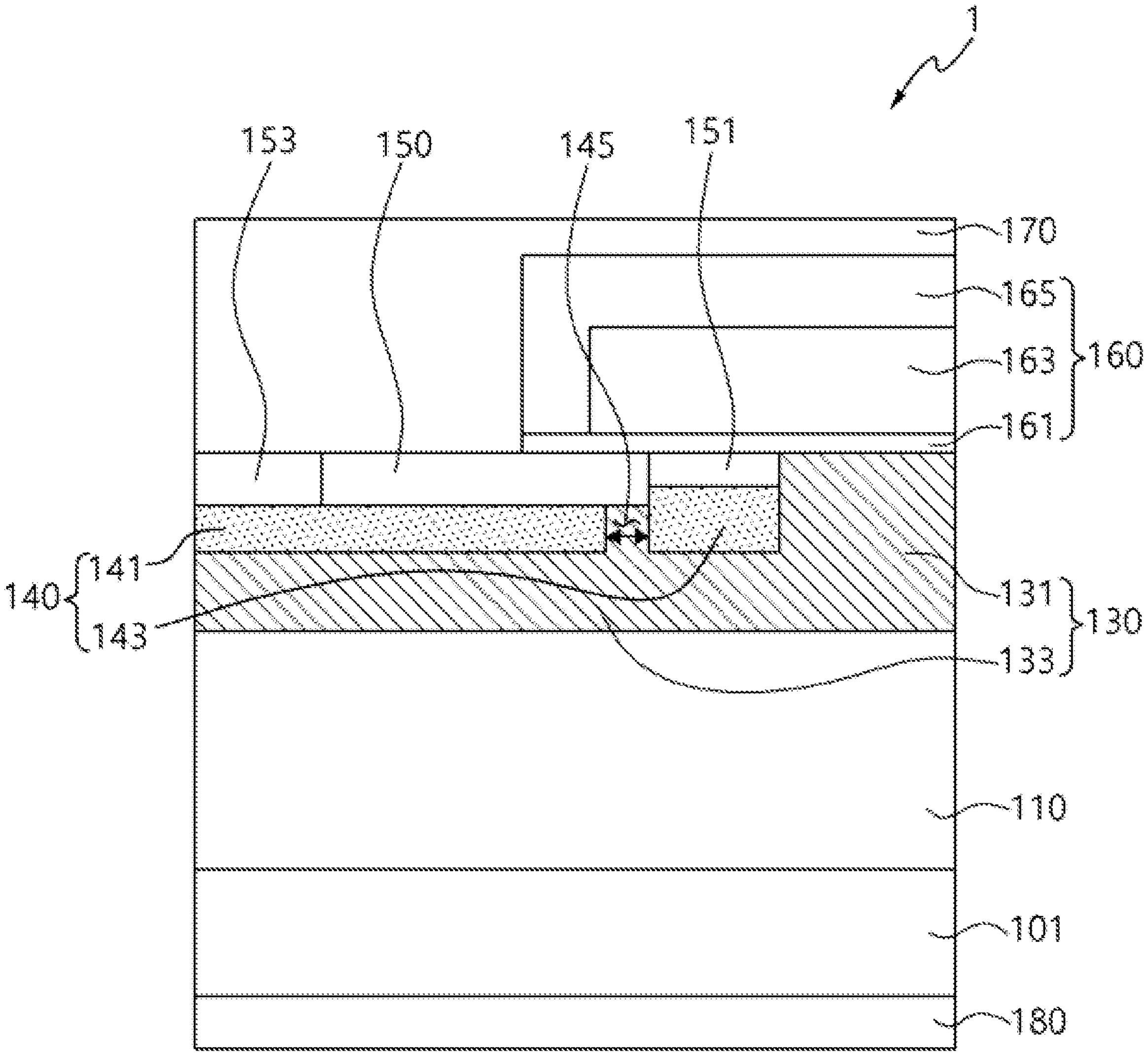
FIGS. 5-6 are cross-sectional views of alternative embodiments of the silicon carbide power semiconductor device shown in FIG. 4.
Figure 6:
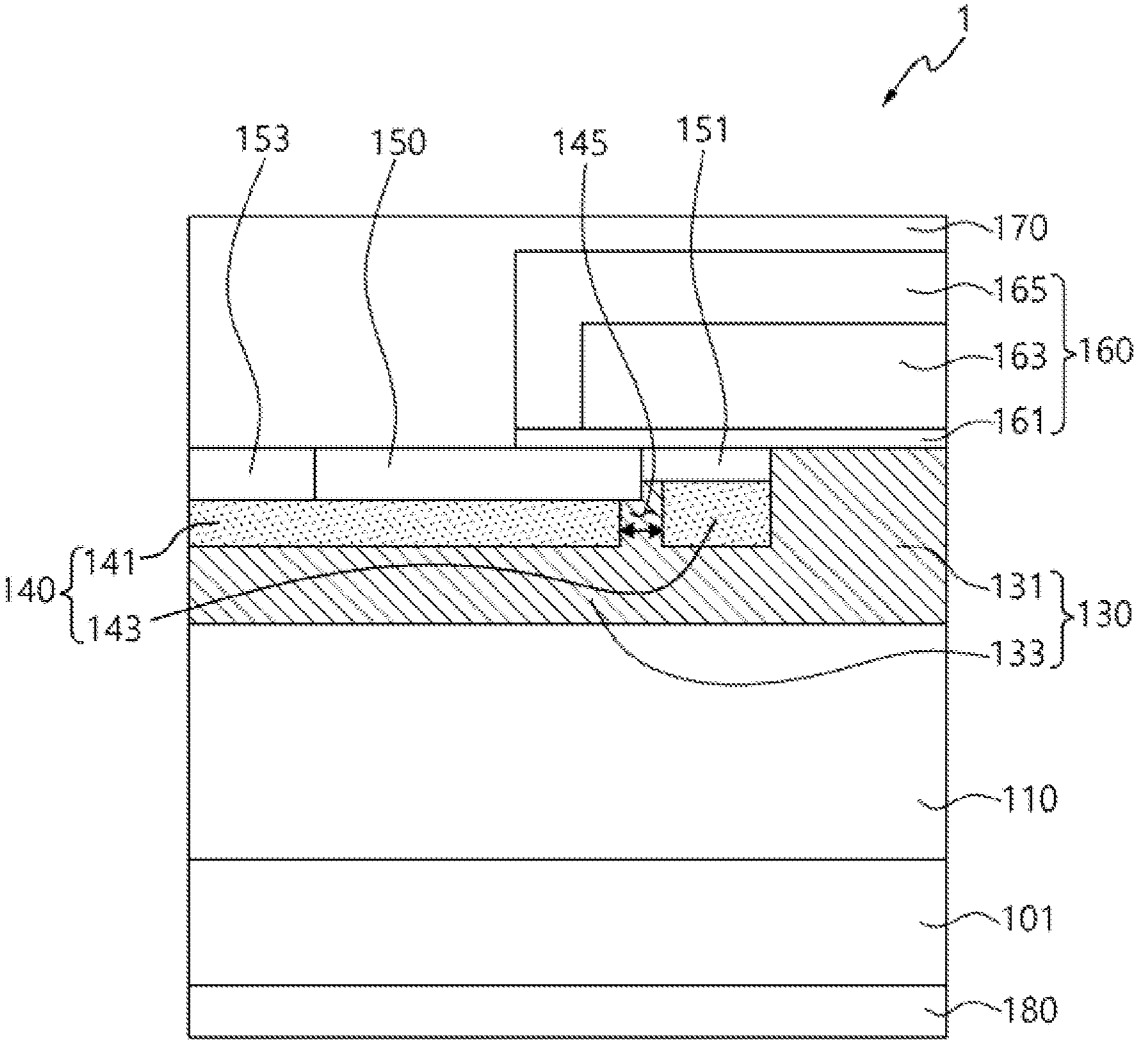

FIG. 2 is a plan view of a silicon carbide power semiconductor device according to a first embodiment of the present disclosure; FIG. 3 is a cross-sectional view along the line A-A' in FIG. 2; and FIG. 4 is a cross-sectional view along the line B-B' in FIG. 2 and FIGS. 5-6 are alternative embodiments of the silicon carbide power semiconductor device shown in FIG. 4. For convenience of description, it should be noted that components omitted from the plan view of FIG. 2 are shown in the cross-sectional views of FIGS. 3-6.

Hereinafter, a silicon carbide power semiconductor device 1 according to a first embodiment of the present disclosure will be described in detail with reference to the accompanying drawings.

Referring to FIGS. 2 to 6, the present disclosure relates to a silicon carbide power semiconductor device 1 and, more particularly, to a silicon carbide power semiconductor device 1 capable of improving on-resistance characteristics of the device by including a shield region (or well region) 140 below a gate 160 with an opening therein.

First, referring to FIGS. 2 to 4, the silicon carbide power semiconductor device 1 according to a first embodiment of the present disclosure may include a substrate 101. The substrate 101 may include, for example, a silicon carbide (SiC) wafer doped with a high concentration of impurities having a second conductivity type. To be specific, the substrate 101 may be or comprise, for example, a 4H-SiC or 6H-SiC substrate. In addition, the second conductivity-type impurity in the substrate 101 may include, for example, phosphorus.

A drift region 110 may be on the substrate 101. The drift region 110 may include, for example, a SiC epitaxial layer grown on the upper surface of the SiC single crystal substrate 101, while maintaining a specific crystal orientation relationship with the crystal orientation of the substrate 101, but the scope of the present invention is not limited thereto. In addition, the drift region 110 may comprise a polytype silicon carbide layer, and may comprise a low-concentration impurity doped region having the second conductivity type. The drift region 110 may be formed by, for example, chemical vapor deposition (CVD), but is not limited thereto and may be formed by various processes such as molecular beam epitaxy (MBE), sublimation epitaxy, and liquid phase epitaxy.

A JFET region 130 may be in or on the drift region 110. The JFET region 130 comprises a highly doped region having the second conductivity type and may be formed by epitaxial growth or an ion implantation process. The JFET region 130 may have a uniform or non-uniform impurity doping concentration. To describe the structure of the JFET region 130 in detail, the JFET region 130 may be between a pair of adjacent bases 151 and shield regions 140 (e.g., along the width direction) and surround the lowermost surface of the shield region 140.

That is, at least part of the JFET region 130 may be deeper than the lowermost surfaces of the shield region 140 and a heavily doped region 153 to surround the regions 140 and 153 in the drift region 110 or on the drift region 110. By forming the JFET region 130 in this way, when a current flows from a drain metal 180 to a source metal 170, which will be described later, the corresponding current may move through not only a region 131 immediately below the gate 160 but also a lower region 133 contacting the lowermost surface of the shield region 140, current distribution due to the addition of the current movement path may be possible. Accordingly, an effect of improving the on-resistance characteristics of the device may be obtained. That is, the region 133 of the JFET region 130 may comprise a carrier storage layer (hereinafter referred to as "CSL") function.

However, in some cases, the JFET region 130 may include the region 131 immediately below the gate 160, separate from the lower region 133 contacting the lowermost surface of the shield region 140. As such, when the CSL is not formed, in the gate turn-on state, that is, the switch-on state, the current may flow below the shield region 140 and may spread at about 45 degrees, thereby avoiding the shield region 140, and thus the entire current flow may be hindered, causing an increase in on-resistance.

The shield region 140 may be in or on the drift region 110 or the JFET region 130. The shield region 140 may comprise an impurity-doped region having a first conductivity type. In general, the ACCUFET has a structure in which the source 150 having the second conductivity type, the base 151 having the second conductivity type, and the drift region 110 having the second conductivity type are all conductive, so that during low-current forward operation, current flows through the second conductivity type (e.g., N-Type) conduction regions, instead of a PN diode.

In addition, although it is common that, during reverse operation, the second conductivity type source 150, base 151, and drift region 110 from the drain metal 180 to the source metal 170 are conductive and are not normally off, current does not flow due to a depletion layer in the junction region between the second conductivity type base 151, the shield region 140 having the first conductivity type, and the JFET region 130 therebetween, a detailed description of which will be described later. In this case, the ability of the device 1 to withstand or tolerate high voltages (e.g., >1000 V) may be achieved by depletion between the shield region 140 and the drift region 110.

However, as described above, in the switch-on state, since the current may flow below the shield region 140 and spread at about 45 degrees to avoid the shield region 140, the entire current flow is hindered, causing an increase in on-resistance. Thus, in terms of the on-resistance of the device 1, it is preferable that the shield region 140 is minimized.

The source 150 and the base 151 may be in the shield region 140 or on the shield region 140. The source 150 is a region doped with a high concentration of second conductivity type impurities, and may have a higher impurity concentration than the drift region 110. The base 151 is an impurity-doped region having the second conductivity type, and preferably contains a lower concentration of impurities than the source 150. In addition, one side of the base 151 may be in contact with the source 150. Preferably, the base 151 does not completely cover the JFET region 130 below the gate 160. The base 151 may have a shallower depth than the source 150, but the scope of the present disclosure is not limited thereto.

Referring to FIGS. 2 and 4 to 6, the aforementioned shield region 140 may have an opening 145 along the width direction below the source 150 and/or the base 151. Referring to FIG. 4, for example, the shield region 140 may include a first part 141 under the source 150 and the heavily doped region 153; and a second part 143 under the base 151. the first region 141 and the second part 143 may be spaced apart from each other along the width direction by the opening 145. The JFET region 130, which is an impurity-doped region having the second conductivity type, may be in the opening 145. That is, the JFET region 130 in the opening 145 may be in direct contact with the source 150 and/or the base 151.

A plurality of openings 145 may be spaced apart from each other along the length direction and may have an island-type shape or arrangement. The openings 145 may be disconnected along the length direction (see FIG. 2). By contrast, when the opening 145 has a stripe or rectangular shape extending along the length direction, the second part 143 may not be connected to the first part 141, and thus, may be floating in the JFET region 130, which is not preferable. The term "island-type" should be understood to include not only the openings 145 having the same width and separation distance from each other along the length direction, but also different widths and separation distances from each other. A connection portion 147 connecting the first part 141 and the second part 143 may be formed between the pair of adjacent openings 145 along the length direction. The connection portion 147 is a part of the shield region 140 and may be an impurity-doped region having the first conductivity type (see FIG. 2). The first part 141, the second part 143 and the connection portion 147 may have identical chemical compositions and identical thicknesses.

As previously described, when the opening(s) 145 have an island-type shape, between adjacent openings 145 along the length direction, the shield region 140 (or connection portion 147) may be continuous along the width direction (see FIG. 3) so that the lowermost surfaces of the source 150 and the base 151 thereon do not contact the JFET region 130 in the location(s) of the connection portion 147.

Hereinafter, the structure of the shield region 140 including the opening 145 (FIG. 4) will be described in detail.

Referring to FIG. 4, for example, the first part 141 may contact the entire lowermost surfaces of the source 150 and the heavily doped region 153 to be described later (e.g., along the width direction), while the second part 143 may contact only part of the total area of the lowermost surface of the base 151 (e.g., along the width direction). Thus, the base 151 may contact the JFET region 130 by way of the opening 145.

Alternatively, referring to FIG. 5, the first part 141 may contact only part of the total area of the lowermost surface of the source 150 (e.g., along the width direction), while the second part 143 may contact the entire lowermost surface of the base 151 (e.g., along the width direction). Due to this, the source 150 may contact the JFET region 130 by way of the opening 145.

In a further alternative, referring to FIG. 6, the first part 141 and the second part 143 may both contact only parts of the total areas of the lowermost surfaces of the source 150 and the base 151 (e.g., in the width direction), respectively, so that part of the source 150 and part of the base 151 may both contact the JFET region 130 through the opening 145.

Referring back to FIG. 3, as previously mentioned, when the opening 145 has an island type shape or arrangement, for example, the shield region 140 may contact the entire lowermost surfaces of the source 150 and the base 151 between adjacent openings 145 (e.g., along the length direction), or be continuous along the width direction.

As such, the shield region 140 may be discontinuous along a direction from the source 150 to the base 151, so that the cross-sectional area or volume of the JFET region 130 may be relatively large (e.g., in comparison with an otherwise identical device in which the shield region 140 does not contain any openings), and thus the on-resistance characteristics of the JFET region 130 may improve.

In addition, during the reverse operation of the device 1, the opening 145 may result in a PNP structure (e.g., a "sandwich" structure) comprising the first part 141 of the shield region 140 (having the first conductivity type), the JFET region 130 (having the second conductivity type) in the opening 145, and the second part 143 of the shield region 140 (having the first conductivity type) along the width direction. Due to built-in field resulting from such a sandwich structure, the JFET region 130 in the opening 145 is completely depleted, so that the normally-off characteristics of the device 1 may achieved. In this case, the device 1 may be able to withstand or tolerate high voltages as a result of the depletion between the shield region 140 and the drift region 110 therebelow.

Referring again to FIGS. 2 to 4, the heavily doped region 153 may be adjacent to or in contact with the source 150 and on a side of the source 150 opposite from the base 151. The heavily doped region 153 may be on or in the drift region 110 or the JFET region 130, and may comprise, for example, a region heavily doped with impurities having the first conductivity type.

In addition, the gate 160 may be on the drift region 110 or the JFET region 130. The gate 160 may at least partially overlap the shield region 140 and the source 150.

The gate 160 may include a gate oxide layer 161 on the JFET region 140 and a gate electrode 163 on the gate oxide layer 161. The gate oxide layer 161 may also be on the base 151 and at least part of the source 150. The gate electrode 163 may comprise, for example, a polysilicon layer doped with impurities. In addition, an insulating layer 165 may surround the gate electrode 163 and the gate oxide layer 161. The insulating layer 165 covers sidewalls of the gate electrode 163 and may at least partially cover an upper surface of the gate electrode 163 (e.g., the insulating layer 165 may have an opening therein for a conductive contact or via to contact the gate electrode 163). The gate 160 may have a stripe (e.g., rectangular) and/or planar shape, but the scope of the present disclosure is not limited thereto.

The source metal 170 may be on or over the substrate 101, the JFET region 130, the source 150, and/or the heavily doped region 153. The source metal 170 may cover the insulating layer 165, and may include nickel (Ni) or aluminum (Al), but is not limited thereto. The source metal 170 may make ohmic contact with the source 150 and the heavily doped region 153.

The drain metal 180 may be on the lowermost surface of the substrate 101. The drain metal 180 may be electrically connected to a drain terminal (not shown). For example, the drain metal 180 may include nickel (Ni) or silver (Ag), but is not limited thereto.

Figure 7:
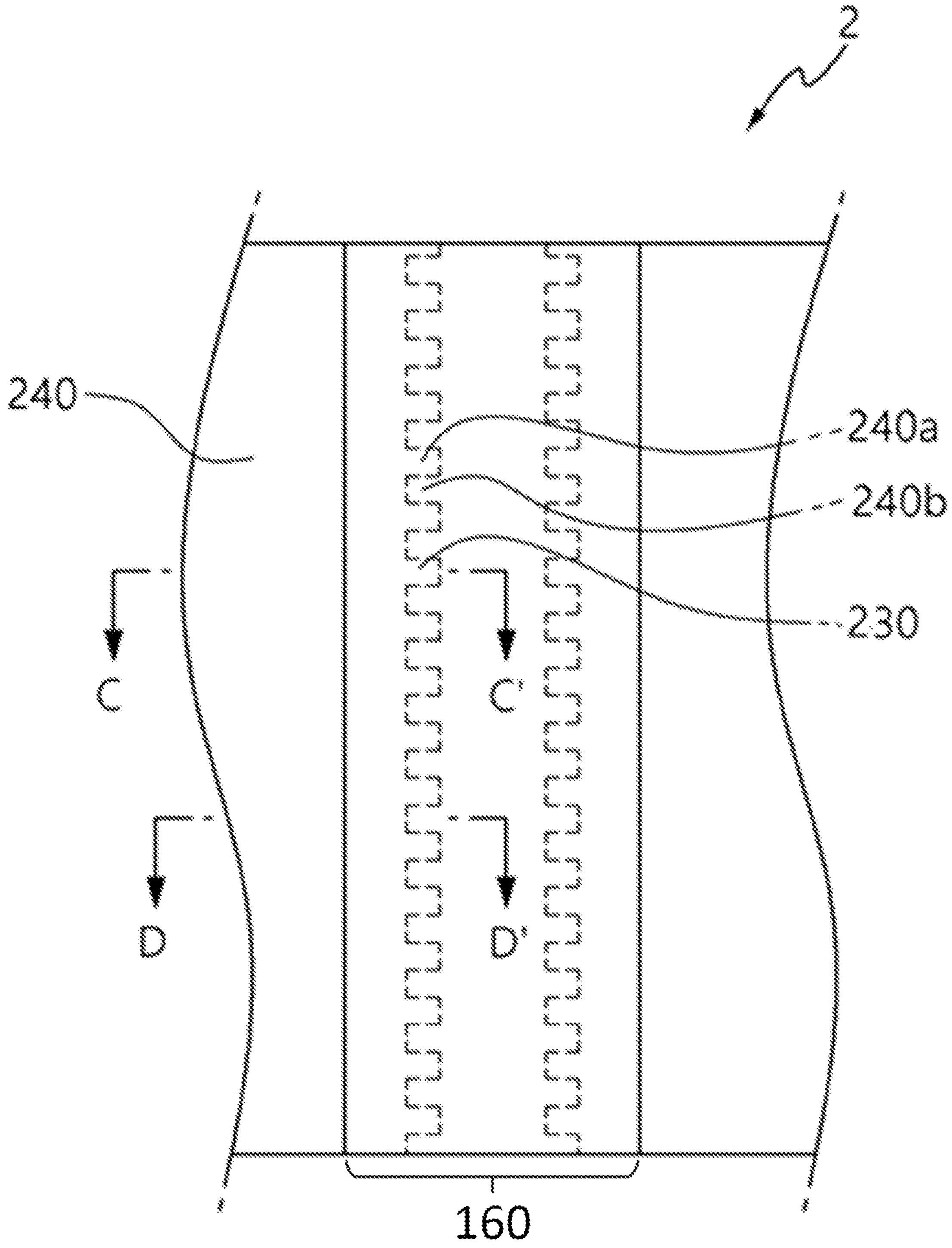
FIG. 7 is a plan view of a silicon carbide power semiconductor device according to a second embodiment of the present disclosure.
Figure 8:
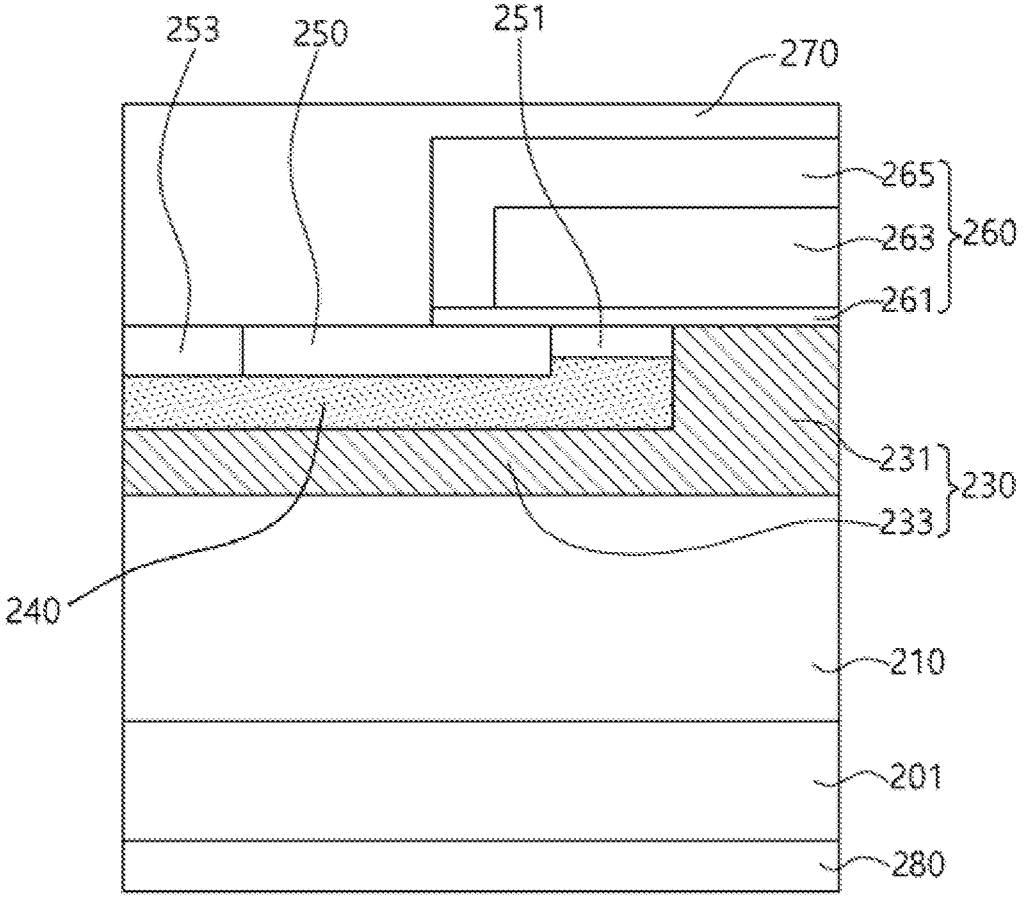
FIG. 8 is a cross-sectional view along the line C-C' in FIG. 7.

FIG. 7 is a plan view of a silicon carbide power semiconductor device according to a second embodiment of the present disclosure; FIG. 8 is a cross-sectional view of the silicon carbide power semiconductor device of FIG. 7 along the line CC' in FIG. 7; and FIG. 9 is a cross-sectional view of the silicon carbide power semiconductor device of FIG. 7 along the line D-D' in FIG. 7.

Hereinafter, a silicon carbide power semiconductor device 2 according to a second embodiment of the present disclosure will be described in detail with reference to the accompanying drawings. For the structures in the silicon carbide power semiconductor device 2 according to the second embodiment that are substantially the same as in the device 1 according to the first embodiment, a "2" is written at the beginning of the identification number in the drawings, instead of the number "1", and additional explanations related to this will be omitted. In the silicon carbide power semiconductor device 2 according to the second embodiment, only the shield region 240, which is different from that of the first embodiment, will be described in detail.

Figure 9:
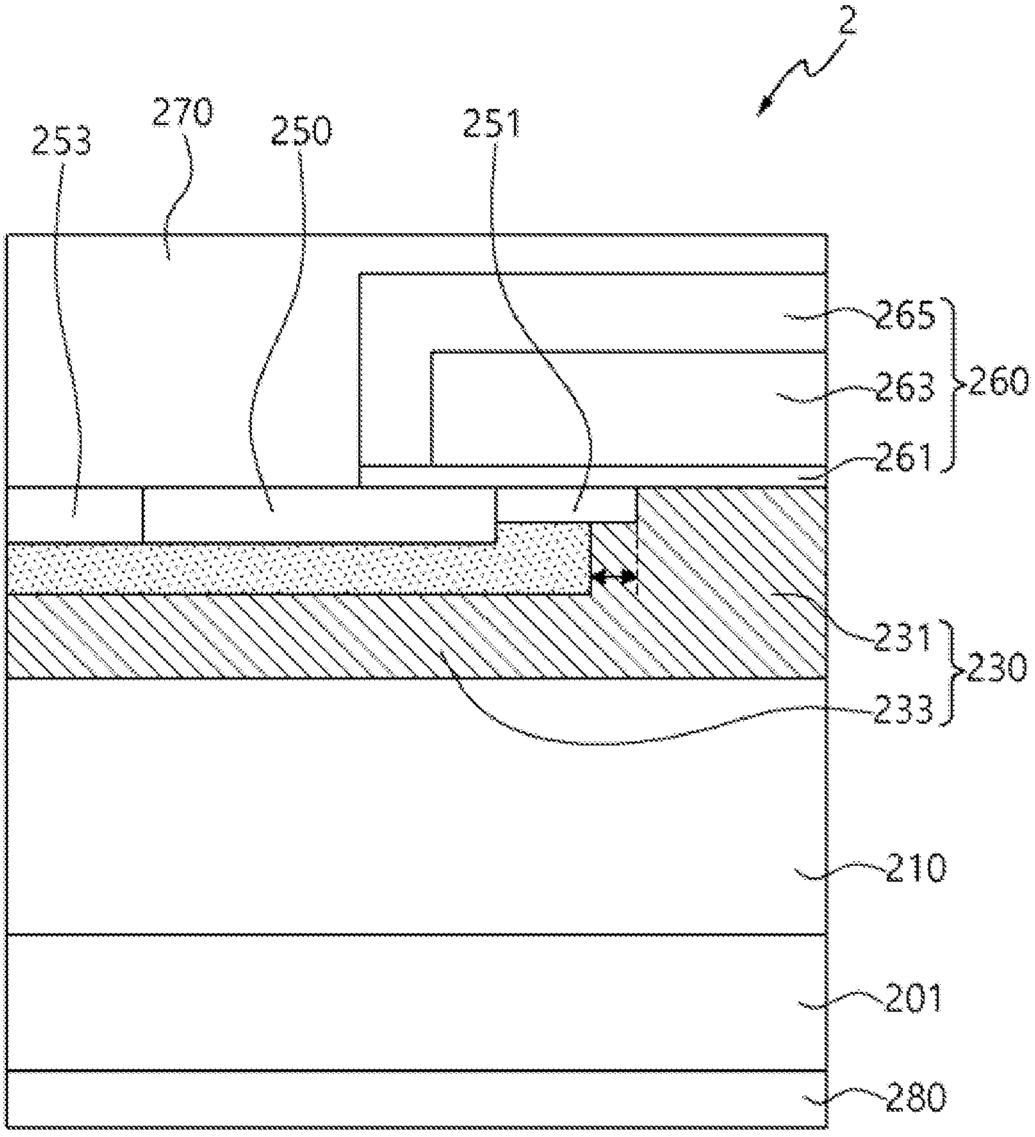
FIG. 9 is a cross-sectional view along the line D-D' in FIG. 7.

Referring to FIGS. 7 to 9, the present disclosure relates to a silicon carbide power semiconductor device 2 and, more particularly, to the silicon carbide power semiconductor device 2 including a continuous shield region 240 (e.g., that is continuous along the width direction), but which exposes parts of the lowermost surface of the base 251, thereby improving the on-resistance characteristics of the device 2.

Referring to FIG. 7, the shield region 240 according to the second embodiment may have at least one sidewall with a concave-convex or sawtooth shape, or that contains a series of alternating square or rectangular projections and recesses, along the length direction. it may be preferable that the entire sidewall of the shield region 240 has the concavo-convex shape or the series of alternating square or rectangular projections and recesses. That is, the shield region 240 may have a plurality of protrusions **240*a* and a plurality of recesses 240*b* along the length direction, and for example, the protrusions 240*a* and the recesses 240*b* may alternate and repeat. At this time, the term "protrusion" refers to a structure protruding or extending toward a central axis or plane of the gate 260 along the length direction in a plan view (e.g., FIG. 7), and "recess" refers to a structure that complements the protrusion along the length and/or width direction in the plan view. At this time, the shield regions 240 on opposite sides of the gate 160 in FIG. 7 may be symmetrical or asymmetrical along the central axis or plane of the gate 160 in the length direction. In the asymmetrical case, the shield regions 240 may be offset so that the protrusions 240*a* on one side face the recesses 240*b* on the other side along the length direction. In addition, although in FIG. 7, the sidewalls having the protrusions 240*a* and the recesses 240*b*** are shown, some or all of the sidewalls may have a curved shape, and the scope of the present disclosure is not limited by a specific shape.

Referring to FIGS. 7 and 8, the protrusion **240*a* may contact the entire lowermost surfaces of the source 250 and the base 251 along the width direction. That is, the protrusion 240*a* may extend to a boundary or interface between the base 251 and the JFET region 230 or to a point adjacent to the boundary or interface. Accordingly, the protrusion 240*a* may contact the entire lower potion of the base 251 along the width direction, but may contact only a part of the lowermost surface of the base 251 in some cases. That is, it is sufficient that the sidewall of the protrusion 240***a* is closer to the center of the gate 260 than the sidewall of the recess 240*b*.

Referring to FIGS. 7 and 9, the shield region 240 adjacent to the recess 240*b* along the width direction generally contacts the entire lowermost surface of the source 250, but the recess 240*b* exposes at least part of the lowermost surface of the base 251 to the JFET region 130. Since the shield region 240 according to the second embodiment is continuous along the width direction, the lowermost surface of the base 251 adjacent to the JFET region 230 along the width direction may be exposed to the JFET region 230 thereunder.

In this way, as the shield region 240 has recesses 240*b* therein, the cross-sectional area or volume of the JFET region 230 may be relatively large, and thus, the on-resistance of the JFET region 230 may improve.

Furthermore, during the reverse operation of the device 2, a PNP structure comprising the shield region 240 (specifically, the protrusion 240*a* having the first conductivity type), the JFET region 130 (having the second conductivity type), and another part of the shield region 240 (specifically, another protrusion 240*a* having the first conductivity type) may be along the length direction. Due to a built-in field resulting from such a PNP structure, the JFET region 130 between the adjacent protrusions 240*a* in the length direction is completely depleted, to achieve the normally-off characteristics of the device 2. In this case, the device 2 may be able to withstand or tolerate high voltages as a result of the depletion between the shield region 240 and the drift region 210 therebelow.

The above detailed description is illustrative of the present disclosure. In addition, the above description shows and describes various embodiments of the present disclosure, and the present disclosure can be used in various other combinations, modifications, and environments. In other words, changes or modifications are possible within the scope of the concept of the disclosure herein, the scope equivalent to the disclosure, and/or within the scope of skill or knowledge in the art. The above-described embodiments describes various states for implementing the technical idea of the present disclosure, and various changes for specific applications or fields of use of the present disclosure are possible. Accordingly, the detailed description of the present disclosure is not intended to limit the present disclosure to the disclosed embodiments.

What is claimed is:

1. A silicon carbide power semiconductor device, comprising:
- a substrate;
- a drift region on the substrate, the drift region having a second conductivity type dopant at a first concentration;
- a JFET region on the drift region, the JFET region having the second conductivity type dopant at a second concentration greater than the first concentration;
- a shield region having a first conductivity type on the drift region;
- a source having the second conductivity type on the shield region;
- a base having the second conductivity type, on the shield region between the source and the JFET region;
- a gate including a gate insulating layer on the JFET region and a gate electrode on the gate insulating layer;
- a source metal on the source; and
- a drain metal on a lowermost surface of the substrate,
- wherein the shield region has one or more openings therein, the JFET region contacts a lowermost surface and a sidewall of the shield region, and a part of the JFET region is within the one or more openings and contacts a lowermost surface or a sidewall of the base.

2. The silicon carbide power semiconductor device of claim 1, wherein the JFET region contacts a lowermost surface of the source and/or the lowermost surface of the base through the one or more openings.

3. The silicon carbide power semiconductor device of claim 1, wherein the JFET region has a lowermost surface at a position deeper than that of the shield region.

4. The silicon carbide power semiconductor device of claim 1, further comprising:
- a highly doped region having the first conductivity type, adjacent to or in contact with the source.

5. The silicon carbide power semiconductor device of claim 1, wherein the shield region has a varying width as the shield region extends along a length direction.

6. The silicon carbide power semiconductor device of claim 1, wherein the shield region is continuous along a width direction.

7. The silicon carbide power semiconductor device of claim 6, wherein the sidewall of the shield region is under the gate with a plurality of alternating protrusions and recesses.

8. The silicon carbide power semiconductor device of claim 7, wherein the lowermost surface of the base contacts the JFET region in the recesses.

9. The silicon carbide power semiconductor device of claim 6, wherein the JFET region comprises:
- a subregion immediately below the gate; and
- a carrier storage layer in contact with a lowermost surface of the shield region.

10. The silicon carbide power semiconductor device of claim 6, comprising first and second shield regions on opposite sides of the gate that are symmetrical or asymmetrical to each other with respect to a central axis or plane of the gate along a length direction.

11. The silicon carbide power semiconductor device of claim 1, wherein the shield region comprises a plurality of openings, and the plurality of openings are spaced apart from each other.

12. The silicon carbide power semiconductor device of claim 1, wherein the sidewall of the shield region is spaced apart from the sidewall of the base adjacent to the gate.

13. The silicon carbide power semiconductor device of claim 1, wherein the lowermost surface of the base is at a position higher than that of the source.

14. The silicon carbide power semiconductor device of claim 1, wherein the substrate includes a silicon carbide (SiC) wafer doped with impurities having a second conductivity type.

15. The silicon carbide power semiconductor device of claim 14, wherein the substrate comprises a 4H-SiC or 6H-SiC substrate, and the second conductivity-type impurities in the substrate include phosphorus.

* * * * *